United States Patent [19]

Takai

[11] Patent Number: 5,666,318
[45] Date of Patent: Sep. 9, 1997

[54] SEMICONDUCTOR MEMORY DEVICE

[75] Inventor: Yasuhiro Takai, Tokyo, Japan

[73] Assignee: NEC Corporation, Tokyo, Japan

[21] Appl. No.: 518,712

[22] Filed: Aug. 24, 1995

[30] Foreign Application Priority Data

Aug. 24, 1994 [JP] Japan .................... 6-199185

[51] Int. Cl.$^6$ ........................................ G11C 7/00
[52] U.S. Cl. ................. 365/203; 365/149; 365/204
[58] Field of Search ........................... 365/203, 149, 365/204

[56] References Cited

U.S. PATENT DOCUMENTS 5,351,215  9/1994  Tanabe ........................ 365/203
5,469,395  11/1995  Kuwabara et al. .......... 365/203

FOREIGN PATENT DOCUMENTS

541085  2/1983  Japan .

Primary Examiner—Son T. Dinh
Attorney, Agent, or Firm—Sughrue, Mion, Zinn, Macpeak & Seas

[57] ABSTRACT

After performing high speed sensing with shutting off digit line pair, in which digit line is connected to an objective memory cell for access, only the digit line which is connected to the memory cell is electrically connected to the sense amplifier to perform re-writing of information to the memory cell by the corresponding sense amplifier. In subsequent balancing and pre-charging process, pre-charging is performed after sufficient balance of potential is established in the digit line pairs. By this, no extra charging current will flow in the digit line and/or the pre-charging power source to reduce power consumption.

10 Claims, 6 Drawing Sheets

SEMICONDUCTOR MEMORY DEVICE

BACKGROUND OF THE INVENTION

1. Field of the Invention

The present invention relates generally to a semiconductor memory device. More specifically, the invention relates to a dynamic random-access-memory (RAM) having a self-refreshing mode.

1. Description of the Related Art

Figure 5:
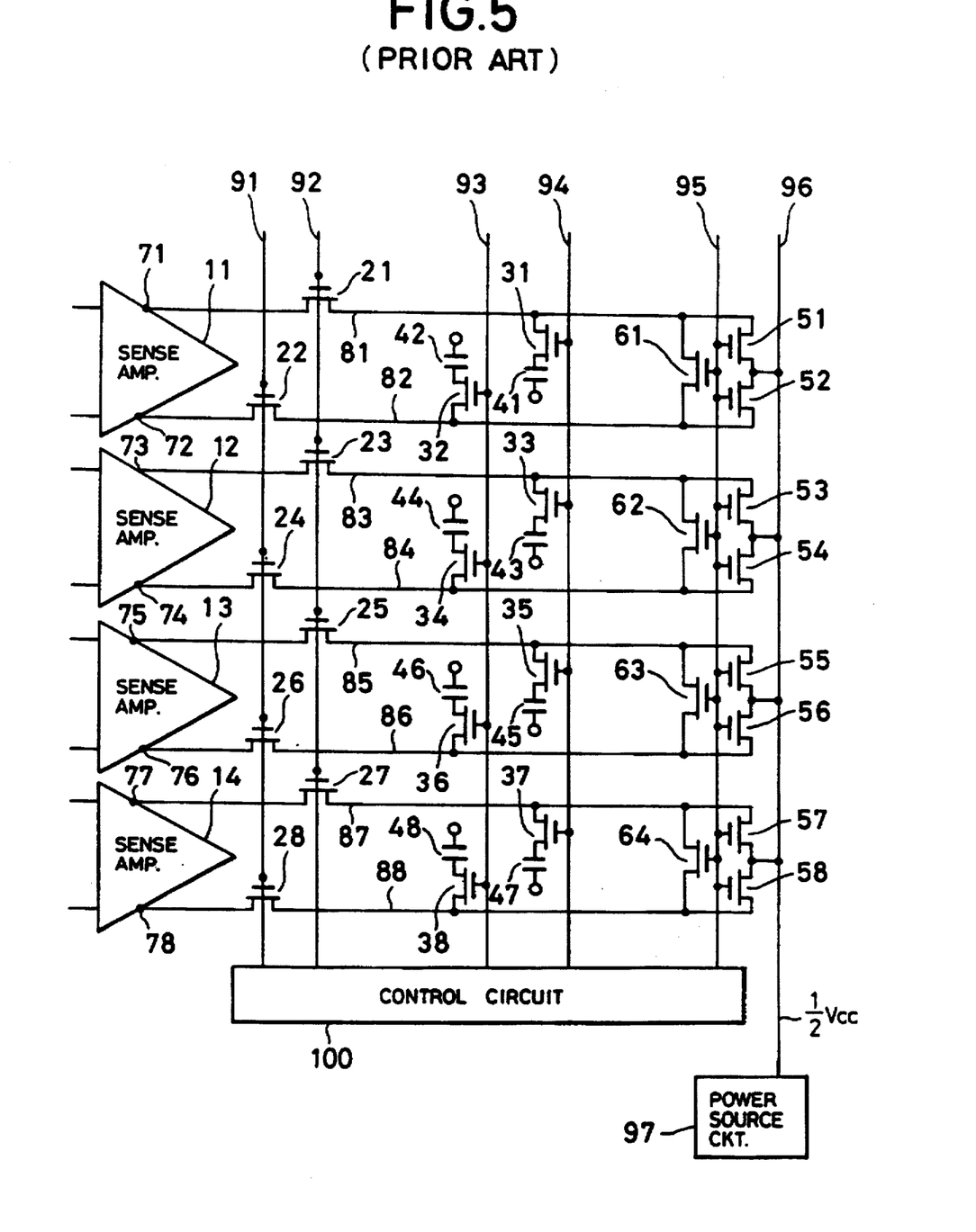
FIG. 5 is an illustration showing an example of the conventional DRAM circuit.
Figures 6A, 6B:
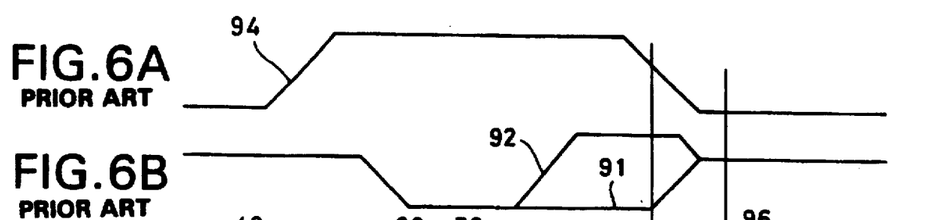
FIG. 6A is an illustration one word line of the circuit of FIG. 5.
FIG. 6B is an illustration the gate control signals of the circuit of FIG. 5.
Figures 6C, 6D:
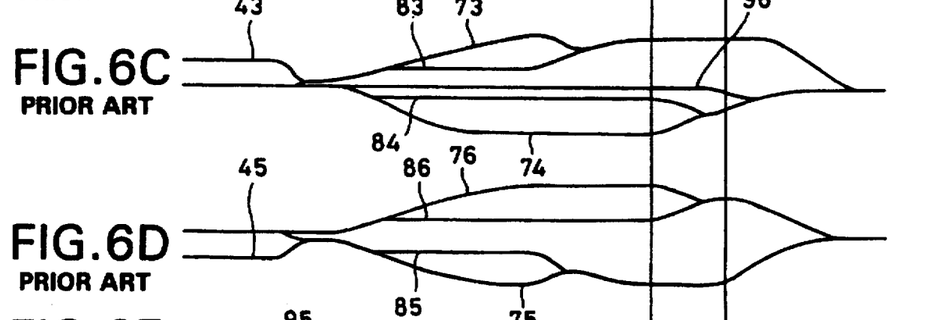
FIG. 6C is an illustration of a memory cell in connection with a bit line pair of the circuit of FIG. 5.
FIG. 6D is an illustration of another memory cell in connection with a bit line pair of the circuit of FIG. 5.
Figure 6E:
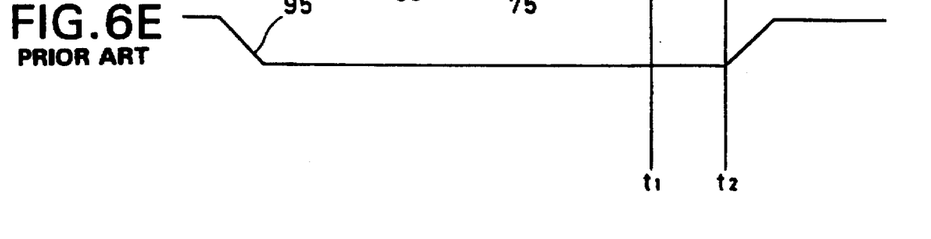
FIG. 6E is an illustration pre-charging control signal of the circuit of FIG. 5.

One example of RAM device of this type has been illustrated in FIG. 5, which has been disclosed in Japanese Unexamined Patent Publication (Kokai) No. Heisei 5-41085. In the example shown, switching elements (transfer gates) which can independently control electrical ON and OFF between respective node points of bit or bit line pairs and respective node points of internal node pair of the sense amplifier, are provided for reducing operation current.

In the circuit of FIG. 5, each memory cell element forming the memory cell array comprises one transistor and one capacitor. In the example shown, respective memory cell elements are formed with cell transistors 31 to 38 and cell capacitors 41 to 48 for storing information. FIG. 5 shows the memory cell array of 4 bits×2 word for the purpose of illustration and for simplification.

The cell capacitors (hereinafter referred to as "memory cell") 41 and 42 of the first bit perform reading out and writing in of information on respective bit lines 81 and 82 of a bit line pair. The memory cells 43 and 44 of the second bit perform reading out and writing in of information on respective bit lines 83 and 84 of the bit line pair. Similarly, the memory cells 45 and 46 of the third bit perform reading out and writing in of information on respective bit lines 85 and 85 of the bit line pair. Also, the memory cells 47 and 48 of the fourth bit perform reading out and writing in of information on respective bit lines 87 and 88 of the bit line pair.

The memory cell transistors 31, 33, 35 and 37 of the first word are controlled ON and OFF by a word line 94. On the other hand, the memory cell transistors 32, 34 36 and 38 of the second word are controlled ON and OFF by a word line 93.

Sense amplifiers 11 to 14 are provided corresponding to respective bit line pair for detecting and amplifying information of corresponding bit pairs.

Transfer gates 21 to 28 are provided for controlling ON and OFF between respective internal node points (input/output nodes) 71 to 78 of the sense amplifier and the bit lines 81 to 88. The transfer gates 21, 23, 25 and 27 are simultaneously switched ON and OFF by a gate control signal 92. On the other hand, the transfer gates 22, 24, 26 and 28 are simultaneously switched ON and OFF by a gate control signal 91.

Between bit lines forming respective bit line pairs, transistors 61 to 64 are provided for balancing respective bit lines at the equal potential. These transistors 61 to 64 are controlled to be switched ON and OFF by a balance pre-charge control signal 95.

On the other hand, pre-charge transistors 51 to 58 are provided corresponding to respective bit line pairs. By turning ON these transistors 51 to 58 by the balance pre-charge control signal 95, corresponding bit lines are pre-charged at (½)Vcc via the transistors 51 to 58. The (½)Vcc is generated by a power source circuit 97.

A control circuit 100 generates the control signals 91 to 95.

The operation of the circuit shown in FIG. 5 is shown in detail with reference to the timing charts of FIG. 6(A)–(E).

The discussion is given with respect to memory cells 43 and 45 respectively storing high level data and low level data.

At first, the word line 94 is selected. Then, the data stored in the memory cells 43 and 45 are read out to the bit lines 83 and 85 via the cell transistors 33 and 35. Then, the data read out to the bit lines 83 and 85 is transferred to the nodes of the sense amplifier 74 and 75 via the transfer gates 23 and 25.

Next, the difference potential of the [digit] bit lines is gradually amplified by the sense amplifiers 12 and 13. In conjunction therewith, the gate control signals 91 and 92 are set to a low level to shut off the transfer gates 23, 24, 25 and 26 and thus electrically shut off the bit lines. By this, the nodes at which potentials be amplified are limited to the sense amplifier. Therefore, it becomes unnecessary to charge and discharge the capacity of the bit line to make high speed sense operation and thus high speed access possible.

After the potentials at the nodes in the sense amplifier being sufficiently amplified, only transfer gate control signal 92 is set to a high level to connect the bit lines 83 and 85 connected to the memory cells 43 and 45, from which data is read out. Therefore, the memory cells 43 and 45 are connected to the nodes 73 and 75 of the sense amplifiers 12, 13 to perform rewriting of data to the memory cells 43 and 45. For efficiently writing the high level data in the word line 94, the transfer gate control signal 92 upon re-writing is boosted at the level higher than or equal to the power source voltage Vcc of the electric power source of the memory circuit.

Finally, upon resetting, the word line 94 is set at low level to shut off the cell transistors 33 and 35. The other gate control signal 91 is set at high level (timing t1) to connect the bit lines 84 and 85 to the nodes 74 and 76 in the sense amplifier. Also, by setting the balance pre-charge control signal 95 to high level (timing t2), the bit line pairs 83, 84 and 85, 86, and the (½)Vcc power source line 96 are mutually connected to establish a balance of the bit lines and to pre-charge at (½)Vcc level.

In the sequence of operation set forth above, after potentials of the bit lines 84, 86 are amplified at a slight level to the extent not to cause malfunction of the sense amplifier by the operation noise of the gate control signal, the bit lines 84 and 86 are not charged and discharged from the sense amplifier power source. Furthermore, the bit lines, in which cell data are amplified at high level and low level, exchanges charge via the (½)Vcc power source line 96, the charge is cancelled in calculation.

Namely, upon pre-charging (timing at t2 and subsequent timing), if number of cells charged at high level and number of cells charged at low level are equal to each other, the charges of the bit lines are canceled. Therefore, arithmetically, charging and discharging is not performed from the (½)Vcc power source line 96. All charge and discharge current of the bit line becomes ½ when both of bit lines of the bit line pair are to be amplified. Therefore, significant reduction of the operation current can be achieved.

The conventional semiconductor memory device may reduce the charge and discharge current of the bit lines to be half, in calculation. However, in practical operation, since charge and discharge current may flow upon balance pre-charging, the charge and discharge current cannot be reduced to [be] half. Namely, since the balance pre-charge control signal and so forth flows for a long distance through the memory cell array, the operational wave form may be rounded.

When the level of the control signal 95 exceeds the potential on the bit line 85 so as to be greater than or equal to a threshold voltage of an NMOS transistor, both of the transistors 55 and 63 becomes conductive to establish a balance between the bit lines 85 and 86 of the bit line pair. Then, the bit line 85 is connected to the (½)Vcc power source line 96. Subsequently, when the level of the signal exceeds the potential on the bit line 84 so as to correspond to the threshold voltage, both of the transistors 54 and 62 become conductive to establish balance between the [digit] bit lines 83 and 84 of the [digit] bit line pair. Then, the [digit] bit line 84 can be connected to the (½)Vcc power source line 96.

Though the process set forth above, the (½)Vcc power source line 96 is connected to bit lines 84, 85 having lower potential than (½)Vcc, namely to the bit lines at the lower level side in all bit line pairs irrespective of high level or low level of the data in the memory cells. Therefore, the (½)Vcc power source line 96 may lower the level due to discharge of the potential.

Accordingly, during the period set forth above, the [digit] bit line 84 and 85 and so forth are charged via the (½)Vcc power source line 96 from the power source of a power source circuit 97.

Finally, when the level of the balance precharge control signal 95 exceeds the potential of the (½)Vcc power source line so as to correspond to the threshold voltage, the transistors 53 and 56 become conductive to connect the bit lines 83 and 86 to the (½)Vcc power source line 96. By this, all of the transistors 53, 54, 55, 56, 62 and 63 for balance precharging are placed into the conductive state.

At this time, the charge supplied from the (½)Vcc power source circuit 97 generated in the former half process of balancing pre-charging, becomes extra, the grounding line of the power source circuit 97 is discharged through the (½)Vcc power source line 96.

Accordingly, upon balance pre-charging, due to difference of conduction timing of the pre-charge transistors caused by level difference between the bit lines, wasteful charging and discharging of current may be caused.

SUMMARY OF THE INVENTION

Therefore, it is an object of the present invention to provide a semiconductor memory device which can reduce an operation current significantly.

According to the first aspect of the invention, a semiconductor memory device comprises:
- a plurality of memory cells;
- a plurality of bit line pairs for reading out and writing in information with respect to the plurality of memory cells;
- a plurality of sense amplifiers corresponding to the plurality of bit line pairs, each sense amplifier performing detection and amplification of information with respect to corresponding bit line pair;
- switching means for performing a connection control operation to connect each bit line to a respective sense amplifier, each switching means respectively corresponding to one bit line and one node of one of the plurality of sense amplifier;
- balancing control means for setting all of bit lines of the plurality of bit line pairs at a common potential level upon resetting of the plurality of [digit] bit line pairs after the connection control operation, and
- pre-charging control means for supplying a recharging potential for the plurality of [digit] bit line pairs after setting of all of the bit lines at the common potential level by the balancing control means.

In the preferred construction,
the balancing control means includes a switching means for performing shorting control between two bit lines of the plurality of bit line pairs upon resetting. The balancing control means may further include a means for performing shorting control between adjacent bit lines of adjacent bit line pairs. Also, the pre-charging control means may include a pre-charging power source, a pre-charging power supply line for supplying the output of the pre-charging power source to respective of the plurality of bit line pairs, and switching elements for controlling shorting between the output of the pre-charging power source and the pre-charging power supply line after setting all of the bit lines at a common potential level by the balancing control means.

The balancing control means and the pre-charging control means may be active in a self-refreshing mode of operation.

According to another aspect of the invention, a semiconductor memory device includes:
- a plurality of bit line pairs including first bit lines and second bit lines;
- a first memory cell group including a plurality of memory cells respectively connected to said first bit lines of the plurality of bit line pairs;
- a second memory cell group including a plurality of memory cells respectively connected said second bit lines of the plurality of bit line pairs;
- a plurality of sense amplifiers corresponding to the plurality of bit line pairs, respectively, each of the sense amplifiers performing detection and amplification of information with respect to a corresponding bit line pair, the plurality of sense amplifiers having first internal nodes and second internal nodes;
- first switching means for performing respective connection control between the first bit lines of the bit lines pairs and the first internal nodes;
- second switching means for performing respective connection control between the second bit lines of the bit line pairs and the second internal nodes;
- means for performing control so that an electrical connection between the internal nodes of the sense amplifiers and the corresponding bit line pairs are shut off by the first and second switching means after a selection and reading out operation of the first memory cell group;
- means for controlling re-writing to the first memory cell group by establishing respective electrical connection between the first internal nodes of the sense amplifiers and the first bit lines of the plurality of bit line pairs by the first switching means after amplification by the sense amplifiers;
- control means for establishing respective electrical connection between the second internal nodes of the sense amplifiers and the second bit lines of the plurality of bit [digit] line pairs by the second switching means, after completion of rewriting;
- balancing control means for setting each bit line of said plurality of bit line pairs at a common potential level after establishing electrical connection by said control means;
- pre-charging means for supplying a pre-charging potential for the plurality of bit line pairs after setting each bit line at the common potential level by the balancing control means.

BRIEF DESCRIPTION OF THE DRAWINGS

The present invention will be understood more fully from the detailed description given herebelow and from the accompanying drawings of the preferred embodiment of the invention, which, however, should not be taken to be limited to the present invention, but are for explanation and understanding only.

In the drawings.

DESCRIPTION OF THE PREFERRED EMBODIMENT

The preferred embodiment of a semiconductor memory device according to the present invention will be discussed hereinafter in detail with reference to the accompanying drawings. In the following description, numerous specific details are set forth in order to provide a thorough understanding of the present invention. It will be obvious, however, to those skilled in the art that the present invention may be practiced without these specific details. Well-known structures are not shown in detail so as not to obscure the present invention unnecessarily.

Figure 1:
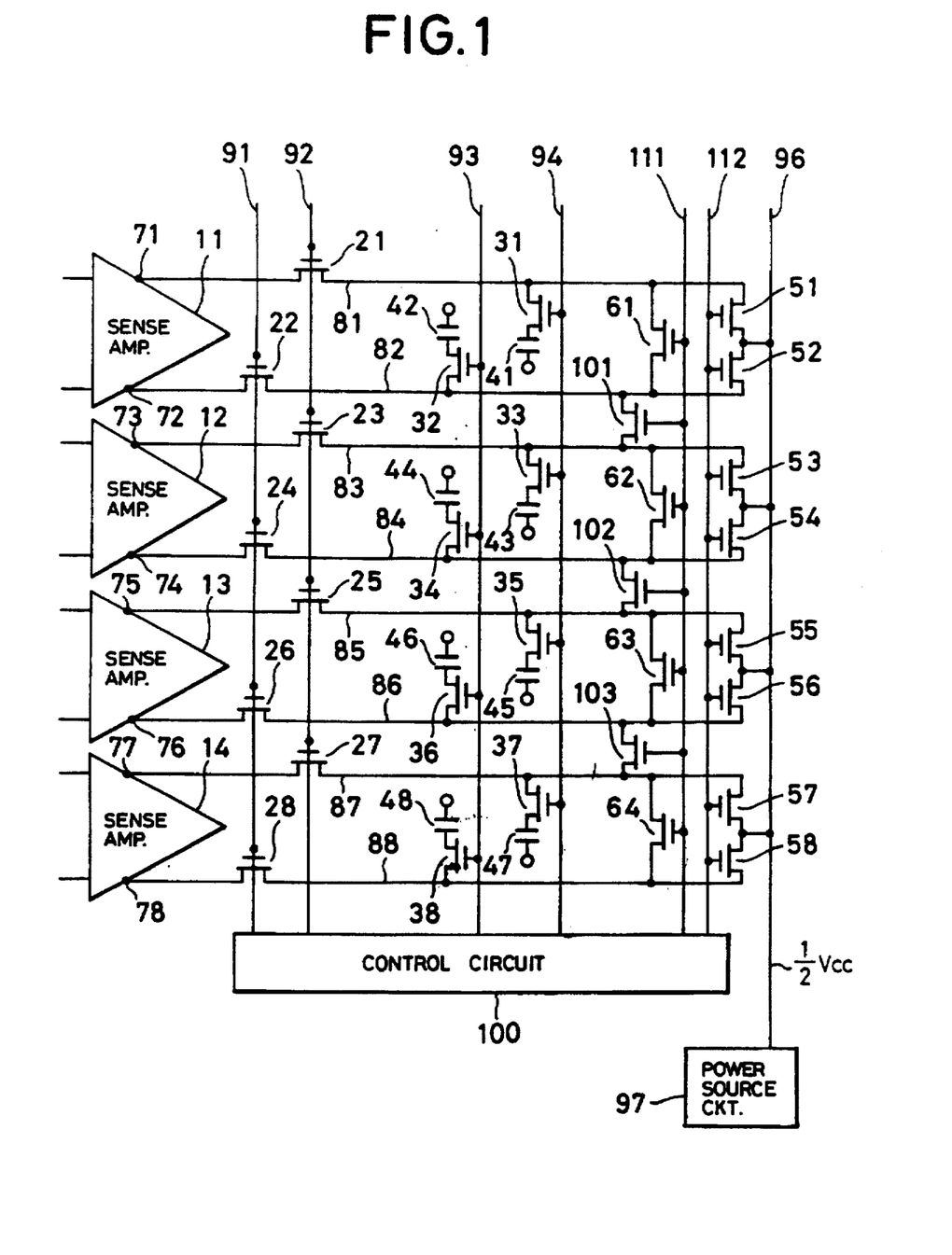
FIG. 1 is a circuit diagram showing the first embodiment of a semiconductor memory device according to the present invention.
Figure 2A:
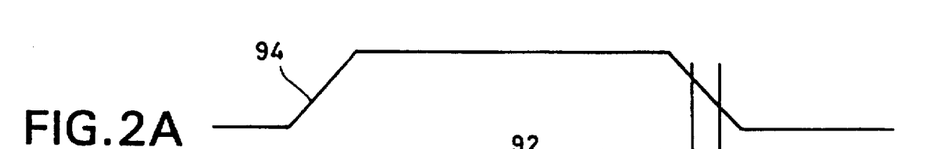
FIG. 2A is an illustration on word line of the circuit of FIG. 1.
Figure 2B:
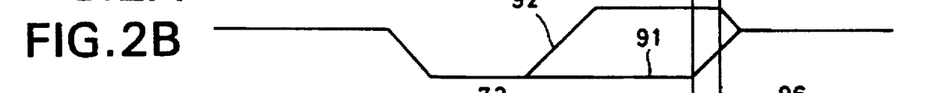
FIG. 2B is an illustration the gate control signals of the circuit of FIG. 1.
Figure 2C:
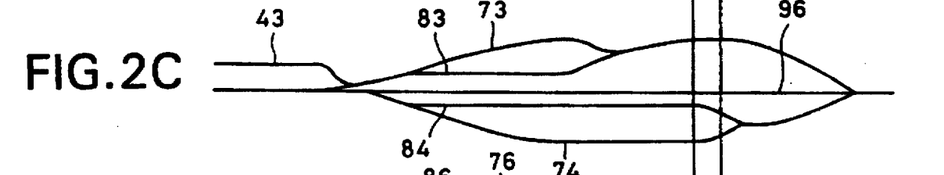
FIG. 2C is an illustration of a memory cell in connection with a bit line pair of the circuit of FIG. 1.
Figures 2D, 2E:
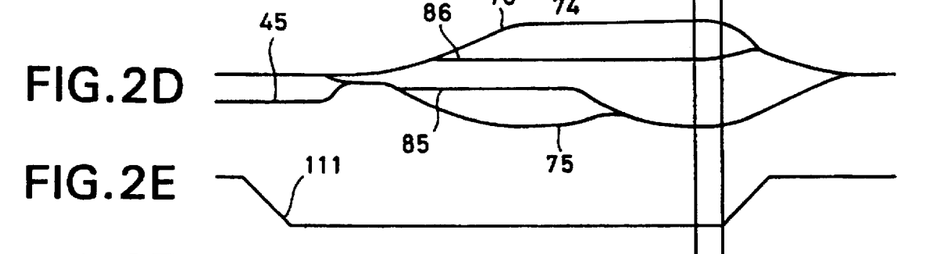
FIG. 2D is an illustration of another memory cell in connection with a bit line pair of the circuit of FIG. 1.
FIG. 2E is an illustration balancing control signal of the circuit of FIG. 1.
Figure 2F:
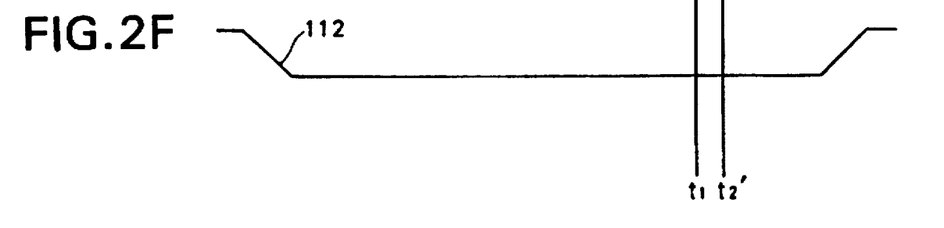
FIG. 2F is an illustration pre-charging control signal of the circuit of FIG. 1.

FIG. 1 is a circuit diagram of the first embodiment of a semiconductor memory device according to the present invention. Throughout the Figures, reference numerals like those shown in FIG. 5 represent like elements. Discussing differences between FIG. 1 and the prior art illustrated in FIG. 5, the balancing operation and pre-charging operation are separated to be independent of each other in the circuit of FIG. 1. For balancing operation, the balancing transistors 61 to 64, which correspond to respective bit line pairs., are controlled to be turned ON and OFF by a balancing control signal 111.

On the other hand, for the pre-charging operation, the pre-charging transistors 51 to 58, which correspond to respective bit line pairs, are controlled to be turned ON and OFF by a pre-charge control signal 112.

Also, balancing transistors 101 to 103 are provided for connecting adjacent bit lines 82, 83; 84, 85; 86, 87 between bit line pairs at electrically equal potential. The balancing transistors 101 to 103 are controlled to be turned ON and OFF by the balancing control signal.

A control circuit 100 generates the control signals 91 to 94 and 111, 112.

FIGS. 2(A)–2(F) are a timing chart showing signal waveforms in operation of the circuit of FIG. 1.

As in the discussion of the prior art, the following discussion will be given for the memory cells 43 and 45, which store high level data and low level data respectively. In the circuit of FIG. 1, the operations of performing sensing operation by selecting the word line 94, re-writing to the memory cell, and placing respective transfer gates 23 to 26 into conductive state by turning the gate control signals 91 and 92 into high level (timing t1) are similar to that of FIGS. 5 and 6.

Upon balancing pre-charging, at first, the balance control signal 111 is set at high level to connect respective bit line pairs to make them electrically equal potentials by the transistors 61 to 64. In conjunction therewith, adjacent bit lines between respective bit line pairs are electrically connected to make them at equal potential by the transistors 101 to 103.

When the number of cells having high level data and the number of cells having low level data are equal to each other, the balancing potential level of respective bit lines becomes (½)Vcc. Thereafter, even when the pre-charge control signal 112 is set at high level to turn ON the transistors 51 to 58 to electrically connect the (½)Vcc power source line 96 and respective bit lines, charge is not transferred so that no wasteful discharge current will flow. It should be noted that the operation power source of the memory circuit is Vcc.

Figure 3:
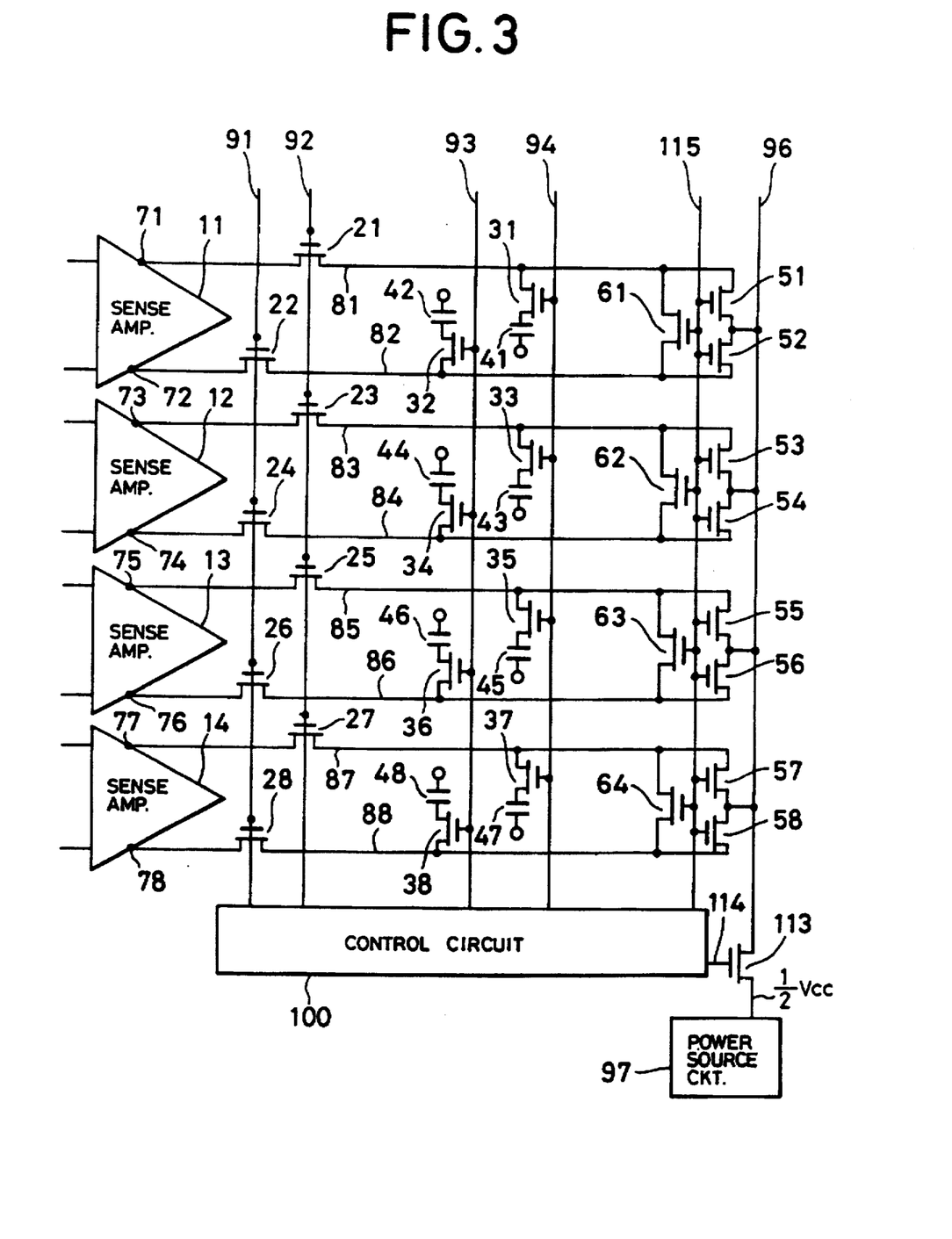
FIG. 3 is a circuit diagram showing the second embodiment of a semiconductor memory device according to the present invention.
Figure 4A:
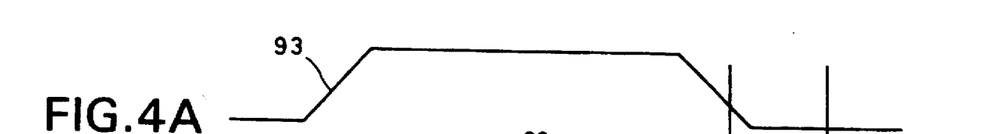
FIG. 4A is an illustration one word line of the circuit of FIG. 3.
Figures 4B, 4C:
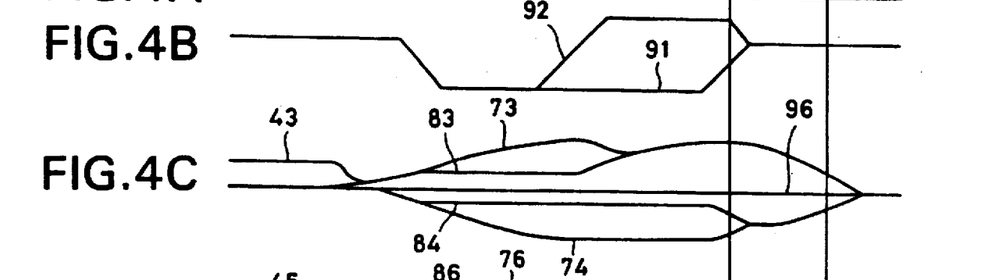
FIG. 4B is an illustration the gate control signals of the circuit of FIG. 3.
FIG. 4C is an illustration of a memory cell in connection with a bit line pair of the circuit of FIG. 3.
Figures 4D, 4E:
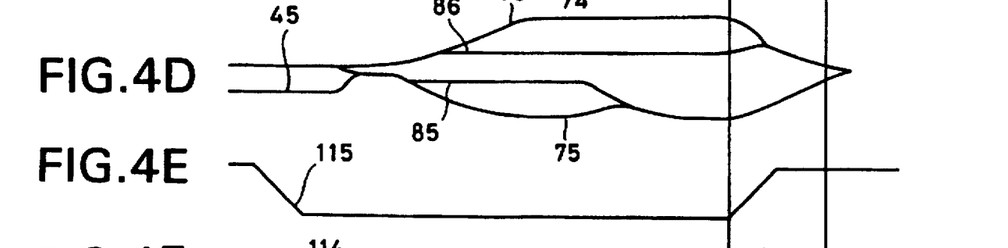
FIG. 4D is an illustration of another memory cell in connection with a bit line pair of the circuit of FIG. 3.
FIG. 4E is an illustration balancing control signal of the circuit of FIG. 3.
Figure 4F:
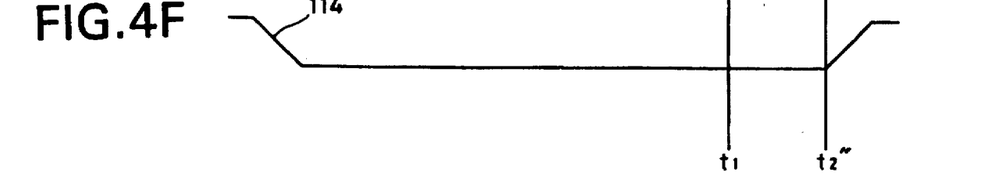
FIG. 4F is an illustration pre-charging control signal of the circuit of FIG. 3.

FIG. 3 shows the second embodiment of the semiconductor memory device according to the present invention. In FIG. 3, like reference numerals to those in FIGS. 1 and 5 will represent like elements. The following discussion will be given only for those aspects different from FIG. 5. Three sets of transistor groups 51, 52, 61; 53, 54, 62; 55, 56, 63; and 57, 58, 64 are provided corresponding to respective bit line pairs. All of these transistor groups are controlled to be turned ON and OFF by a balancing control signal 115.

On the other hand, a pre-charging power source (½)Vcc is generated from the power source circuit 97. However, supply of the power source (½)Vcc to the (½)Vcc power source line 96 is controlled by controlling ON and OFF a gate transistor 113 by a precharge control signal 114.

A control circuit 100 generates the control signals 91 to 94 and 114, 115.

FIGS. 4(A)–(F) are a timing charts showing signal waveforms for illustrating the operation of the circuit of FIG. 3. The following discussion will be given for the memory cells 43 and 45, which store high level data and low level data respectively. In the circuit of FIG. 3, the operations of performing sensing operation by selecting the word line 94, re-writing to the memory cell, and placing respective transfer gates 23 to 26 into conductive state by turning the gate control signals 91 and 92 into high level (timing t1) are similar to that of FIGS. 5,6 and FIG. 1, 2.

Next, the bit line pairs 83, 84 and 85, 86 are electrically connected by setting the balancing control signal 115 at high level. Thereafter, by setting the pre-charging control signal 114 at high level (timing t2), the gate transistor 113 is turned ON to supply the pre-charging power source (½)Vcc to the pre-charging power source line 96. By this, the pre-charging operation is performed. When the number of the cells having the high level data and the number of the cells having the low level data are equal to each other, the balancing voltage at the [digit] bit line pairs becomes (½)Vcc through balancing operation (during period between t1 and t2"). Thus, in the subsequent pre-charging operation, charge is not transferred and therefore, no charging and discharging current will flow.

In the second embodiment of the semiconductor memory device, the one conductor passing through the memory cell array is eliminated from the circuit of the first embodiment. Also, in the second embodiment, the balancing transistors for mutually connecting the adjacent bit line pairs become unnecessary. Therefore, the second embodiment is advantageous in comparison with the first embodiment because of a decrease in the required area of integrated circuit.

In the first and second embodiment, as set forth above, to establish a balance between the bit line pairs at (½)Vcc, it is necessary to have equal number of the high level data and low level data to be stored in the memory cells. Consideration will be given hereinafter with respect to this point.

In general, a pitch of the memory cell of the dynamic RAM dominates the area of the semiconductor integrated circuit, and thus is designed as small as possible. It is necessary to form a contact on an aluminum signal line, i.e. so-called I/O line, externally extracted from the internal node of the sense amplifier via a column switch to the outside of the cell array. A sum of the diameter of the contact and a distance between the adjacent contact is generally greater than a half of the pitch of the memory cell, namely greater than a sum of the width of the bit line and the distance between adjacent bit lines. Therefore, in a folded type dynamic RAM, frequently a common contact is formed at the node via the column switch corresponding to adjacent bit line pairs.

For example, in FIG. 1, the nodes 72 and 73 are connected to a common node via column switches corresponding to the sense amplifiers 11 and 12. Then, the contact is formed on the I/O line from the common node. In this case, the polarities of the stored data in the memory cells 41 and 43 on the same word line becomes opposite. Namely, the data is written in the nodes 72 and 73 from the common I/O line, even when the same data of O is written in from the outside of the semiconductor memory device, high level data is written in one of the memory cells 41 and 43 and low level data is written in the other memory cell 43 or 41.

Accordingly, when data O is written with clearing the content of the semiconductor memory device, an equal number of high level data and low level data are written in the memory cells on the common word line.

Also, when a certain data is written in, it is often determined which data among high level data "1" or low level data "0" will be written in each memory cell, randomly. Therefore, the numbers of the high level data and the low level data become substantially equal to each other. Namely, as set out in the foregoing discussion, the condition to have the equal number of high level data and low level data is the condition which can be quite easily achieved.

Here, when the numbers of the high level data and low level data are not equal, the balance level may offset from (½)Vcc, current will be consumed for recharging to lower efficiency.

When the all of the memory cells on the word line have the same data, the transfer gate may not be operated independently and the charge and discharge current on the bit line pair may be degraded in the equivalent level to the point where the both node nodes of the bit line pair are amplified.

However, as set forth above, since the numbers of the high level data and low level data are substantially equal to each other, the charge and discharge current on the bit line pair can be clearly further reduced over that in the prior art except for the case where the same date is stored in all of the memory cells.

In the present invention, when the numbers of the high level data and low level data stored in the memory cells on the common word line are equal to each other, balance level becomes (½)Vcc. However, this is the ideal case and in practice, the balance level cannot be accurately set at (½)Vcc due to imbalance between charging and discharging in the sense operation. In such case, the numbers of the high level data and low level data at the maximum efficiency are not equal. However, this fact may not negate the effectiveness of the present invention.

In the operation of the present invention, pre-charging is required after sufficiently establishing a balance of the bit lines upon resetting. The balancing transistors and the pre-charging transistors cannot attain higher performance by increasing the transistor width and also keep the area on the semiconductor integrated circuit small enough. Therefore, in normal writing in and reading out operation, there can be a degradation of row address strobe (RAS) pre-charging period.

Namely, when the period between balancing and pre-charging is set longer to satisfactorily attain the effect of the invention, if balance cannot be established at (½)Vcc, a reading out operation may be initiated before the bit line pair is sufficiently pre-charged at (½)Vcc. In such case, due to accumulation effect in reading operation, the balance level of the bit line pair may further offset from (½)Vcc, offsetting of the operation point of the sense amplifier and thus causing malfunction.

Accordingly, the present invention is not suitable for use in normal writing in and reading out operation. However, the present invention may be optimal in self-refreshing mode, in which timing is automatically generated internally in the semiconductor integrated circuit.

Namely, in the normal mode, the RAS pre-charging period defined on a data sheet is approximately 40 ns, whereas, in the self-refreshing mode, most of typically 100 μs of period can be spent for balancing and pre-charging. Therefore, the present invention can be optimally applied for the self-refreshing mode.

In experimental calculation, when the data on all of the memory cells on the word line are the same, the balance level may be offset in the magnitude of (¼) For pre-charging this to (½)Vcc, it will take approximately 30 μs, and thus sufficient time is available.

Accordingly, in self-refreshing mode, the operation set forth above is performed and, in normal mode, the transfer gates 21, 23, 25, 27 are operated in similar manner to the transfer gates 22, 24, 26, 28 to perform balancing and pre-charging simultaneously. Thus, the semiconductor memory device can eliminate refreshing current with avoiding possibility of causing malfunction.

They dynamic RAM forms main memory in a computer system and so forth. All of the dynamic RAM in the memory space may perform operation in the self-refreshing mode during stand-by state, so that the effect of the present invention is significant.

According to the present invention, when the data stored in the memory cell accessed by selection of the word line is read out on the bit line pair, the bit line pair and the sense amplifier are shut off to perform high speed sensing, and thereafter, the only bit line connected to the memory cell are connected to the sense amplifier in advance to perform a high speed re-writing in operation, and in subsequent resetting operation of the bit lines, pre-charging is performed after sufficiently balancing the bit line pair. Therefore, no wasteful charging and discharging of the pre-charging power source may be caused to reduce consumption of current. Therefore, the present invention is particularly effective in self-refreshing mode operation.

For instance, in case of 4 Mbit DRAM, the actual device, in which the potentials on the bit lines of the bit line pair are both amplified, the constantly flowing current component among the measured value of 90 µA of the CBR (CAS Before RAS) refreshing current is 20 µA. Among remaining 70 µA, the charging and discharging current of the bit lines is 30 µA. By application of the present invention, 30 µA of charging and discharging current of the bit lines can be reduced in the extent of 15 µA at maximum.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodied within a scope encompassed and equivalents thereof with respect to the feature set out in the appended claims.

What is claimed is:

1. A semiconductor memory device comprising:
   a plurality of memory cells;
   a plurality of bit line pairs for reading out and writing in information with respect to said plurality of memory cells;
   a plurality of sense amplifiers corresponding to said plurality of bit line pairs, respectively, each of the sense amplifiers performing detection and amplification of information with respect to a corresponding bit line pair, and each of the sense amplifiers having a pair of internal nodes;
   a plurality of switching means, each switching means corresponding to a different bit line and to a different internal node for performing a connection control operation to connect each bit line to a different sense amplifier node;
   balancing control means for setting each bit line of said plurality of bit line pairs at a common potential level upon resetting of said plurality of bit line pairs after said connection control operation by said switching means; and
   pre-charging control means for supplying a pre-charging potential for said plurality of bit line pairs after setting each of said bit lines at the common potential level by said balancing control means.

2. A semiconductor memory device as set forth in claim 1, wherein said balancing control means includes a switching means for performing shorting control between two bit lines of said plurality of bit line pairs, upon resetting.

3. A semiconductor memory device as set forth in claim 2, wherein said balancing control means further comprises a means for performing shorting control between adjacent bit lines of adjacent bit line pairs.

4. A semiconductor memory device as set forth in claim 2, wherein said pre-charging control means comprises a pre-charging power source, a pre-charging power supply line for supplying an output of said pre-charging power source to respective of said plurality of bit line pairs, and switching elements for controlling shorting between the output of said pre-charging power source and said pre-charging power supply line after setting all of said bit lines at a common potential level by said balancing control means.

5. A semiconductor memory device as set forth in claim 1 wherein said balancing control means and said pre-charging control means are active in a self-refreshing mode of operation.

6. A semiconductor memory device comprising:
   a plurality of bit line pairs including first bit lines and second bit lines;
   a first memory cell group including a plurality of memory cells respectively connected to said first bit lines of said plurality if bit line pairs;
   a second memory cell group including a plurality of memory cells respectively connected to said second bit lines of said plurality of bit line pairs;
   a plurality of sense amplifiers corresponding to said plurality of bit line pairs, respectively, each of the sense amplifiers performing detection and amplification of information with respect to a corresponding bit line pair, said plurality of sense amplifiers having first internal nodes and second internal nodes;
   first switching means for performing respective connection control between said first bit lines of said bit line pairs and said first internal nodes;
   second switching means for performing respective connection control between said second bit lines of said bit line pairs and said second internal nodes;
   means for performing control so that an electrical connection between said internal nodes of said sense amplifiers and the corresponding bit line pairs are shut off by said first and second switching means after a selection and reading out operation of said first memory cell group;
   means for controlling re-writing to said first memory cell group by establishing respective electrical connection between said first internal nodes of said sense amplifiers and said first bit lines of said plurality of bit line pairs by said first switching means after amplification by said sense amplifiers;
   control means for establishing respective electrical connection between said second internal nodes of said sense amplifiers and said second bit lines of said plurality of bit line pairs by said second switching means, after completion of re-writing;
   balancing control means for setting each bit line of said plurality of bit line pairs at a common potential level after establishing electrical connection by said control means;

pre-charging means for supplying a pre-charging potential for said plurality of bit line pairs after setting each bit line at the common potential by said balancing control means.

7. A semiconductor memory device as set forth in claim 6, wherein said balancing control means includes a switching means for performing shorting control between two bit lines of said plurality of bit line pairs.

8. A semiconductor memory device as set forth in claim 7, wherein said balancing control means further comprises a means for performing shorting control between adjacent bit lines of adjacent bit line pairs.

9. A semiconductor memory device as set forth in claim 7, wherein said pre-charging control means comprises a pre-charging power source, a pre-charging power supply line for supplying an output of said pre-charging power source to respective of said plurality of bit line pairs, and switching elements for controlling shorting between the output of said pre-charging power source and said pre-charging power supply line 6 after setting all of said bit lines at a common potential level by said balancing control means.

10. A semiconductor memory device as set forth in claim 6 wherein said balancing control means and said pre-charging control means are active in a self-refreshing mode of operation.

* * * * *

UNITED STATES PATENT AND TRADEMARK OFFICE
CERTIFICATE OF CORRECTION

PATENT NO. : 5,666,318
DATED : September 9, 1997
INVENTOR(S) : Yasuhiro TAKAI

It is certified that error(s) appears in the above-identified patent and that said Letters Patent is hereby corrected as shown below:

On the title page:

Item No. [57], ABSTRACT, please delete the Abstract in its entirety and insert as follows:

--A semiconductor memory device in which high speed sensing is performed. Pairs of bit lines for reading out and writing in information to a plurality of memory cells are connected to respective sense amplifiers for detecting and amplifying the information of a corresponding bit line. After switching means perform a connection control operation and the bit lines have been reset, a balancing control means sets the all bit lines to a common potential. Thereafter, a pre-charging means supplies a pre-charging potential to all bit line pairs. Because sufficient balance potential is established in the bit lines, no extra charging current flows in the bit lines or the pre-charging power source, reducing power consumption.--

Col. 1, line 33, change "85" to --86--.

Col. 2, line 7, change "74" to --73--;

line 9, delete "[digit]".

Col. 3, line 61, change "amplifier" to --amplifiers--;

line 64, delete "[digit]";

line 65, after "operation" insert --by the first and second switching means--;

line 67, delete "[digit]".

UNITED STATES PATENT AND TRADEMARK OFFICE
CERTIFICATE OF CORRECTION

PATENT NO. : 5,666,318
DATED : September 9, 1997
INVENTOR(S) : Yasuhiro TAKAI

It is certified that error(s) appears in the above-identified patent and that said Letters Patent is hereby corrected as shown below:

Col. 4, line 58, delete "[digit]".

Col. 7, line 20, delete "[digit]".

Col. 8, line 16, delete "nodes".

Signed and Sealed this

Twenty-first Day of April, 1998

Attest:

BRUCE LEHMAN

*Attesting Officer*  *Commissioner of Patents and Trademarks*